US010798812B2

(12) United States Patent
Kumata et al.

(10) Patent No.: US 10,798,812 B2
(45) Date of Patent: Oct. 6, 2020

(54) PARTICLE ACCELERATOR

(71) Applicant: SUMITOMO HEAVY INDUSTRIES, LTD., Tokyo (JP)

(72) Inventors: Yukio Kumata, Tokyo (JP); Hiroshi Tsutsui, Tokyo (JP)

(73) Assignee: SUMITOMO HEAVY INDUSTRIES, LTD., Tokyo (JP)

( * ) Notice: Subject to any disclaimer, the term of this patent is extended or adjusted under 35 U.S.C. 154(b) by 0 days.

(21) Appl. No.: 16/374,382

(22) Filed: Apr. 3, 2019

(65) Prior Publication Data

US 2019/0239335 A1 Aug. 1, 2019

Related U.S. Application Data

(63) Continuation of application No. PCT/JP2017/034540, filed on Sep. 25, 2017.

(30) Foreign Application Priority Data

Oct. 6, 2016 (JP) ................................ 2016-198179

(51) Int. Cl.
*H01J 37/14* (2006.01)
*H05H 13/00* (2006.01)
(Continued)

(52) U.S. Cl.
CPC ............ *H05H 13/005* (2013.01); *G21K 1/14* (2013.01); *H05H 7/10* (2013.01)

(58) Field of Classification Search
CPC .. H01J 37/1475; H01J 37/3233; H05H 13/02; H05H 13/04; H05H 13/05; H05H 13/10
(Continued)

(56) References Cited

U.S. PATENT DOCUMENTS 2,943,265 A * 6/1960 Kaiser .................... H05H 13/00 315/502
4,641,057 A * 2/1987 Blosser .................... H05H 7/20 313/62
(Continued)

FOREIGN PATENT DOCUMENTS

EP 2 129 193 A1 12/2009
JP H10-256000 A 9/1998
JP 2012-099354 A 5/2012

OTHER PUBLICATIONS

Search report issued in European Application No. 17858242.5, dated Sep. 23, 2019.

(Continued)

*Primary Examiner* — Tung X Le
(74) *Attorney, Agent, or Firm* — Michael Best & Friedrich LLP

(57) ABSTRACT

A particle accelerator includes: a pair of magnetic poles disposed to face each other; a coil which surrounds each of the magnetic poles and generates a first magnetic flux density directing from the magnetic pole on one side to the magnetic pole on the other side; a foil stripper provided on a circling orbit of charged particles to strip off electrons from the charged particles; and a magnetic flux density adjustment unit which generates a second magnetic flux density directing in an opposite direction to a direction of the first magnetic flux density, in which the magnetic flux density adjustment unit makes an absolute value of magnetic flux density at a position of the foil stripper when viewed in a plan view smaller than an absolute value of the first magnetic flux density.

4 Claims, 8 Drawing Sheets

(51) Int. Cl.
*G21K 1/14* (2006.01)
*H05H 7/10* (2006.01)

(58) Field of Classification Search
USPC .......................................... 315/500, 501, 502
See application file for complete search history.

(56) References Cited

U.S. PATENT DOCUMENTS

| | | | | |
|---|---|---|---|---|
| 6,433,494 | B1 * | 8/2002 | Kulish | H05H 1/54<br>250/251 |
| 6,683,426 | B1 * | 1/2004 | Kleeven | H05H 7/10<br>315/500 |
| 7,541,905 | B2 * | 6/2009 | Antaya | H05H 7/04<br>313/62 |
| 2012/0126726 | A1 * | 5/2012 | Antaya | H05H 13/005<br>315/502 |
| 2015/0371811 | A1 * | 12/2015 | Ogawa | H01J 37/21<br>250/305 |

OTHER PUBLICATIONS

International Search Report issued in Application No. PCT/JP2017/034540, dated Dec. 5, 2017.

* cited by examiner

PARTICLE ACCELERATOR

RELATED APPLICATIONS

Priority is claimed to Japanese Patent Application No. 2016-198179, filed Oct. 6, 2016, and International Patent Application No. PCT/JP2017/034540, the entire content of each of which is incorporated herein by reference.

BACKGROUND

Technical Field

A certain embodiment of the present invention relates to a particle accelerator.

Description of Related Art

In particle accelerators such as a cyclotron, a foil stripper is used to strip off electrons of accelerated H− particles and output the particles to the outside of the particle accelerator as an H+ proton beam. The related art discloses a stripping foil for a cyclotron, which is provided with a foil formed of a carbon thin film, and a foil folder for holding the foil.

SUMMARY

According to an embodiment of the present invention, there is provided a particle accelerator including: a pair of magnetic poles disposed to face each other; a coil which surrounds each of the magnetic poles and generates a first magnetic flux density directing from the magnetic pole on one side to the magnetic pole on the other side; a foil stripper provided on a circling orbit of charged particles to strip off electrons from the charged particles; and a magnetic flux density adjustment unit which generates a second magnetic flux density directing in an opposite direction to a direction of the first magnetic flux density, in which the magnetic flux density adjustment unit makes an absolute value of magnetic flux density at a position of the foil stripper when viewed in a plan view smaller than an absolute value of the first magnetic flux density.

BRIEF DESCRIPTION OF THE DRAWINGS

FIGS. 2A and 2B are diagrams schematically showing an operation of the particle accelerator shown in FIGS. 1A and 1B, in which FIG. 2A is a plan view and FIG. 2B is a sectional view taken along line IIB-IIB of FIG. 2A.

DETAILED DESCRIPTION

Figure 1B:
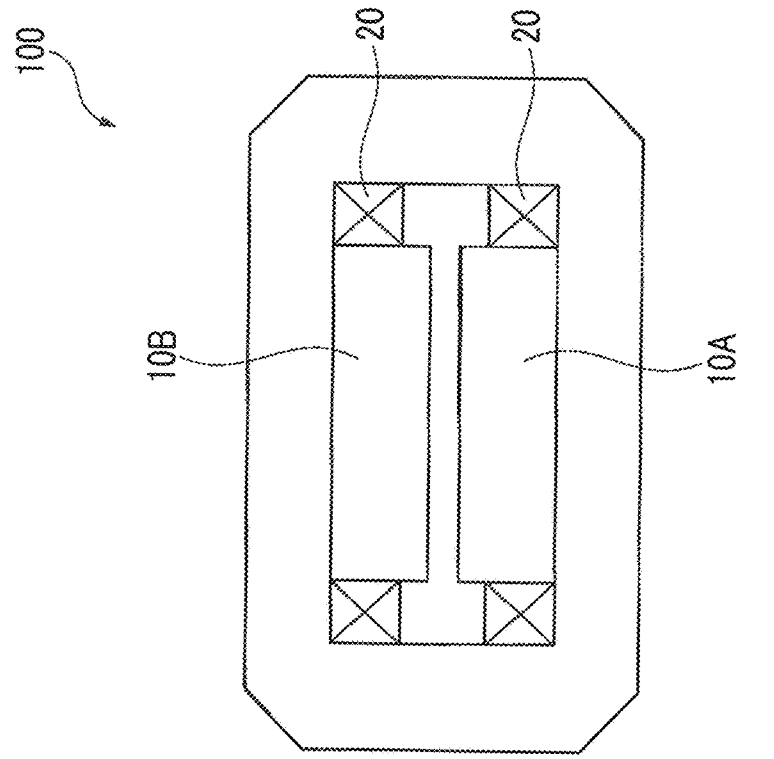
FIG. 1B is a sectional view taken along line IB-IB of FIG. 1A.

In the particle accelerator as described above, the foil of a foil stripper is subjected to a collision of H− having high energy, and therefore, there is a concern that the foil may sublime due to heat generation according to the collision. For this reason, the foil is a relatively short-lived consumable, and thus it is necessary to periodically replace the foil. Further, the higher the current value of an H− beam is, the shorter the life of the foil becomes, and therefore, the frequency of the replacement increases, and maintenance effort or maintenance cost increase. Therefore, it is demanded to extend the life of the foil.

It is desirable to provide a particle accelerator in which it is possible to extend the life of a foil.

The inventors of the present invention have found the following knowledge as a result of earnest research. That is, the inventors have found the reason why the life of a foil of a foil stripper is shortened in a general particle accelerator. The electrons stripped off by the foil rotate to be curved in a direction directing inward from a circling orbit of accelerated particles (negative ions) under the influence of a first magnetic flux density and pass through the foil many times. In this way, the energy of the electrons is applied to the foil, and therefore, the foil reaches a high temperature, and thus sublimation or the like of a material forming the foil occurs to shorten the life of the foil.

The particle accelerator according to the aspect of the present invention is provided with the magnetic flux density adjustment unit which generates the second magnetic flux density directing in the opposite direction to the direction of the first magnetic flux density. The magnetic flux density adjustment unit generates the second magnetic flux density around the foil stripper when viewed in a plan view, thereby making the absolute value of the magnetic flux density (the sum of the first magnetic flux density and the second magnetic flux density) at the position of the foil stripper smaller than the absolute value of the first magnetic flux density (weakening a magnetic field). In this way, the radius of gyration at which the electrons rotate becomes large compared to a case where the first magnetic flux density is generated at the position of the foil stripper. Therefore, it is possible to prevent the foil from reaching a high temperature due to the electrons stripped off by the foil passing through the foil again. Therefore, it is possible to extend the life of the foil.

In the particle accelerator according to the above aspect, the magnetic flux density adjustment unit may generate the second magnetic flux density by a coil. According to this configuration, by adjusting an electric current flowing to the coil, it is possible to adjust the magnitude of the second magnetic flux density. Therefore, it is possible to adjust the second magnetic flux density to an optimal magnitude.

In the particle accelerator according to the above aspect, the magnetic flux density adjustment unit may generate the second magnetic flux density by a magnet. According to this configuration, it is possible to generate the second magnetic flux density without requiring the supply of an electric power.

In the particle accelerator according to the above aspect, the magnetic flux density adjustment unit may include a recovery part which recovers the electrons outside the circling orbit of the charged particles, and the magnetic flux density adjustment unit may generate the second magnetic flux density larger than the absolute value of the first magnetic flux density, thereby making a direction of the magnetic flux density at the position of the foil stripper when viewed in a plan view an opposite direction to a direction of the first magnetic flux density. According to this configuration, the direction of the magnetic flux density (the sum of the first magnetic flux density and the second magnetic flux density) at the position of the foil stripper is the opposite direction to the direction of the first magnetic flux density. Therefore, the electrons stripped off by the foil stripper are curved in a direction directing outward from the circling orbit of the charged particle (negative ions). In this way, the electrons stripped off by the foil can be prevented from passing through the foil again. Further, the electrons are curved in the direction directing outward from the circling orbit, and therefore, it is possible to recover the electrons by disposing the recovery part outside the circling orbit. Therefore, it is possible to more reliably prevent the electrons stripped off by the foil from passing through the foil again.

According to the present invention, a particle accelerator is provided in which it is possible to extend the life of a foil.

Hereinafter, various embodiments will be described in detail with reference to the drawings. In each of the drawings, identical or corresponding portions are denoted by the same reference numerals.

Figure 1A:
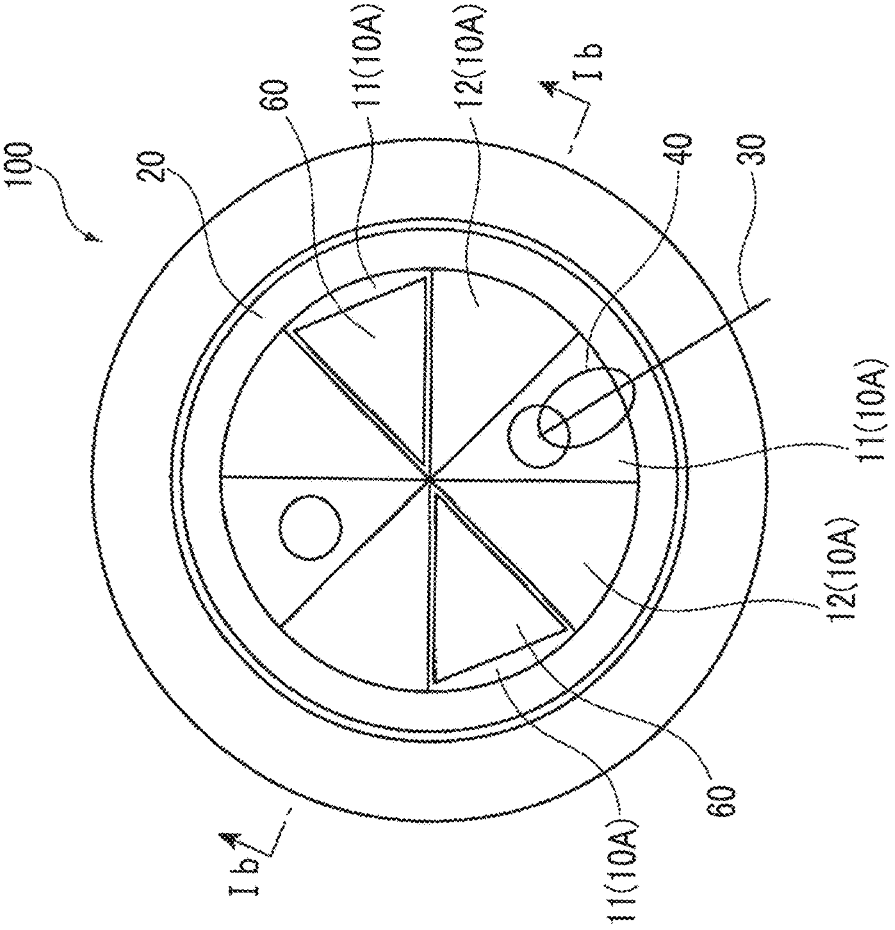
FIG. 1A is a diagram schematically showing a particle accelerator according to an embodiment.
Figure 2A:
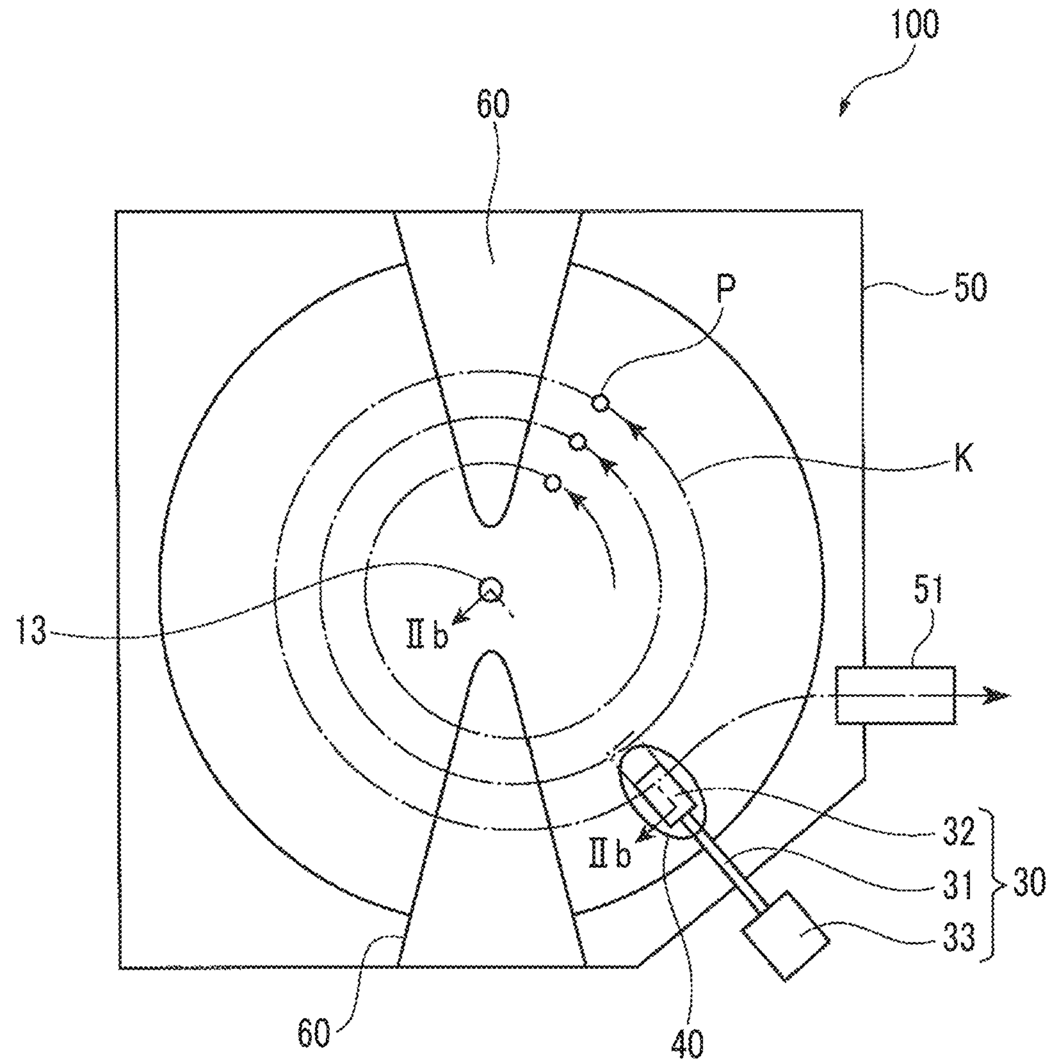
Figure 2B:
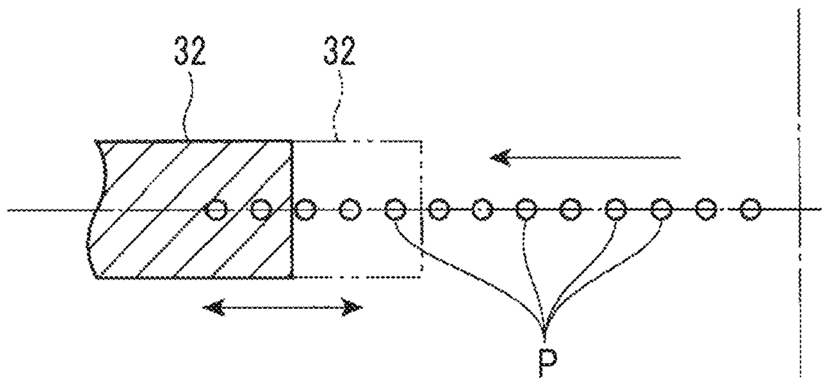

A particle accelerator according to an embodiment of the present invention will be described with reference to FIGS. 1A and 1B and FIGS. 2A and 2B. FIG. 1A is a diagram schematically showing a particle accelerator according to an embodiment, and FIG. 1B is a sectional view taken along line IB-IB of FIG. 1A. Further, FIGS. 2A and 2B are diagrams schematically showing an operation of the particle accelerator shown in FIGS. 1A and 1B, in which FIG. 2A is a plan view and FIG. 2B is a sectional view taken along line IIB-IIB of FIG. 2A. A particle accelerator 100 is a cyclotron which is used to generate charged particle beams by accelerating negative ions P (charged particles), for example, in a neutron capture therapy system for cancer treatment using boron neutron capture therapy (BNCT: Boron Neutron Capture Therapy), or the like. Further, the particle accelerator 100 can also be used as a cyclotron for PET, a cyclotron for RI production, and a cyclotron for nuclear experiment. As shown in FIGS. 1A and 1B and FIGS. 2A and 2B, the particle accelerator 100 includes a pair of magnetic poles 10A and 10B, a coil 20 which surrounds each of the magnetic poles 10A and 10B, a foil stripper 30 which strips off electrons from the negative ions P, and a magnetic flux density adjustment unit 40. Further, the particle accelerator 100 includes a vacuum box 50 in which the negative ions P circle, a pair of acceleration electrodes 60 disposed between the magnetic poles 10A and 10B, and an emission port 51 for extracting protons whose orbit is changed by the foil stripper 30. The negative ions P are supplied into the vacuum box 50 from, for example, a negative ion source device (not shown).

The magnetic poles 10A and 10B are disposed to face each other, and the shape thereof is a cylindrical shape. The facing surfaces of the magnetic poles 10A and 10B are divided into a plurality of sectors which include a plurality of valley regions (valleys) 11 and a plurality of mountain regions (hills) 12, and the valley regions 11 and the mountain regions 12 are formed to alternately appear. With such a configuration, convergence of the negative ions P which are accelerated in the vacuum box 50 is attained by using sector focusing.

The coil 20 has an annular shape and disposed to surround each of the magnetic poles 10A and 10B. An electric current is supplied to the coil 20, whereby a first magnetic flux density B1 (refer to FIG. 3) from the magnetic pole 10A on one side toward the magnetic pole 10B on the other side is generated. That is, an electromagnet is formed by the magnetic pole 10A (or the magnetic pole 10B) and the coil 20.

The foil stripper 30 includes a stripper drive shaft 31 extending along a radial direction of the magnetic poles 10A and 10B, a foil 32 provided at the tip of the stripper drive shaft 31, and a foil drive unit 33 which drives the stripper drive shaft 31 so as to be able to advance and retreat along the radial direction of the magnetic poles 10A and 10B. The foil drive unit 33 includes a high precision motor and the like, and the stripper drive shaft 31 advances and retreats in unit of a range of 10-2 mm to 10-1 mm by the drive control of the foil drive unit 33, and as a result, the foil 32 can advance and retreat so as to cross a circling orbit K of the negative ions P. The foil stripper 30 is disposed, for example, in the valley regions 11 of the magnetic poles 10A and 10B.

The magnetic flux density adjustment unit 40 generates a second magnetic flux density B2 (refer to FIG. 3) directing in the opposite direction (the direction from the magnetic pole 10B on the other side to the magnetic pole 10A on one side) to the direction of the first magnetic flux density B1 which is generated by the magnetic poles 10A and 10B and the coils 20. The magnetic flux density adjustment unit 40 is disposed in the valley regions 11 of the magnetic poles 10A and 10B so as to generate the second magnetic flux density B2 (refer to FIG. 3) around the foil 32 of the foil stripper 30.

The vacuum box 50 includes, for example, a box main body (not shown) and a box lid (not shown). An opening portion having substantially the same diameter as the outer diameter of the magnetic pole 10A on one side is provided in a bottom wall portion of the vacuum box 50, and the surface provided with the valley region 11 and the mountain region 12 of the magnetic pole 10A on one side protrudes from the opening into the vacuum box 50. Further, an exhaust port (not shown) for evacuation is provided in the box main body, and a vacuum pump (not shown) is connected to the exhaust port. The box lid blocks an upper opening of the box main body such that the interior of the vacuum box 50 can be evacuated by the vacuum pump. Similar to the box main body, the box lid is provided with an opening portion having substantially the same diameter as the outer diameter of the magnetic pole 10B on the other side, in order to cause the surface provided with the valley region 11 and the mountain region 12 of the magnetic pole 10B on the other side to protrude into the vacuum box 50.

The pair of acceleration electrodes 60 each has a triangular shape when viewed in a plan view, and is disposed to face each other such that the apex angles thereof face each other. Each of the acceleration electrodes 60 is made of, for example, an electrical conductor such as copper, and is configured by connecting two upper and lower triangles at bottom sides. Then, a pipe for passing a refrigerant for cooling is provided on the plate surface of the acceleration electrode 60.

The pair of acceleration electrodes 60 is located in the valley regions 11 of the magnetic poles 10A and 10B. Then, the tip portions of the acceleration electrodes 60 are mechanically and electrically connected to each other by a connection member. The form of the connection member is not particularly limited, and various shapes can be adopted. For example, the tip portions of the pair of acceleration electrodes 60 may not be electrically connected to each other. In this case, RF electrodes may be separately supplied to the pair of acceleration electrodes 60.

An ion supply port 13 for supplying the negative ions P generated in the negative ion source device into the vacuum box 50 is provided at a center position of the magnetic pole 10A (or the magnetic pole 10B). The negative ion source device is a device that performs arc discharge in a raw material such as hydrogen gas to generate the negative ions P. The negative ions P generated in the negative ion source device are supplied so as to be drawn into the vacuum box 50 through the ion supply port 13, and are accelerated while circling by the acceleration electrodes 60 to which a high-frequency voltage is applied, and thus energy thereof gradually increases. If the energy increases, the radius of gyration of the negative ion P becomes larger, and thus the circling orbit K such as performing helical motion is drawn. The circling orbit K is located on a central plane (median plane) between the pair of magnetic poles 10A and 10B. The negative ion source device may be disposed outside the particle accelerator 100 or may be provided inside the particle accelerator 100.

The foil 32 is made of, for example, a thin film made of carbon. If the foil 32 intrudes onto the circling orbit K of the circling negative ions P and comes into contact with the negative ions P, the foil 32 strips off electrons from the negative ions P. A proton (the accelerated particle) that is deprived of an electron and changed from a negative charge to a positive charge is turned in the direction in which the curvature of the circling orbit K is reversed and an orbit jumps out of the circling orbit K. The emission port 51 for extracting the protons from the inside of the vacuum box 50 is provided on the orbit of the proton after inversion. More specifically, the emission port 51 is provided on the orbit of the proton whose orbit is changed by the foil stripper 30. Therefore, the foil 32 deprives the negative ions P of electrons, and as a result, leads the protons to the emission port 51.

Figure 3:
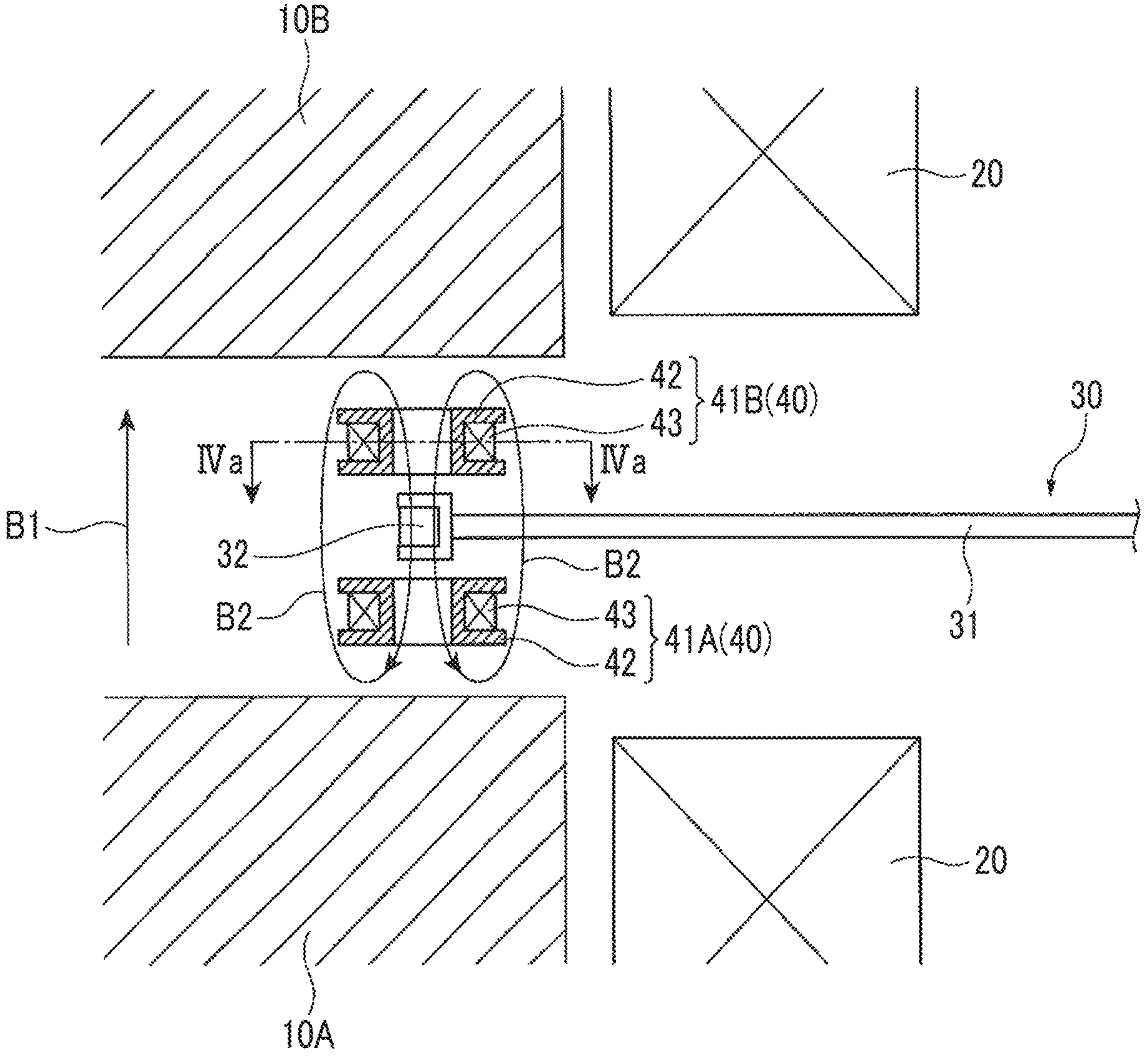
FIG. 3 is a diagram schematically showing a configuration of a magnetic flux density adjustment unit of the particle accelerator shown in FIGS. 1A and 1B.

Subsequently, the configuration of the magnetic flux density adjustment unit 40 will be described in detail with reference to FIGS. 3, 4A, and 4B. FIG. 3 is a diagram schematically showing the configuration of the magnetic flux density adjustment unit of the particle accelerator shown in FIGS. 1A and 1B. Further, FIG. 4A is a diagram schematically showing a cross section taken along line IVA-IVA of FIG. 3, and FIG. 4B is a diagram schematically showing a support structure of the magnetic flux density adjustment unit.

Figure 4B:
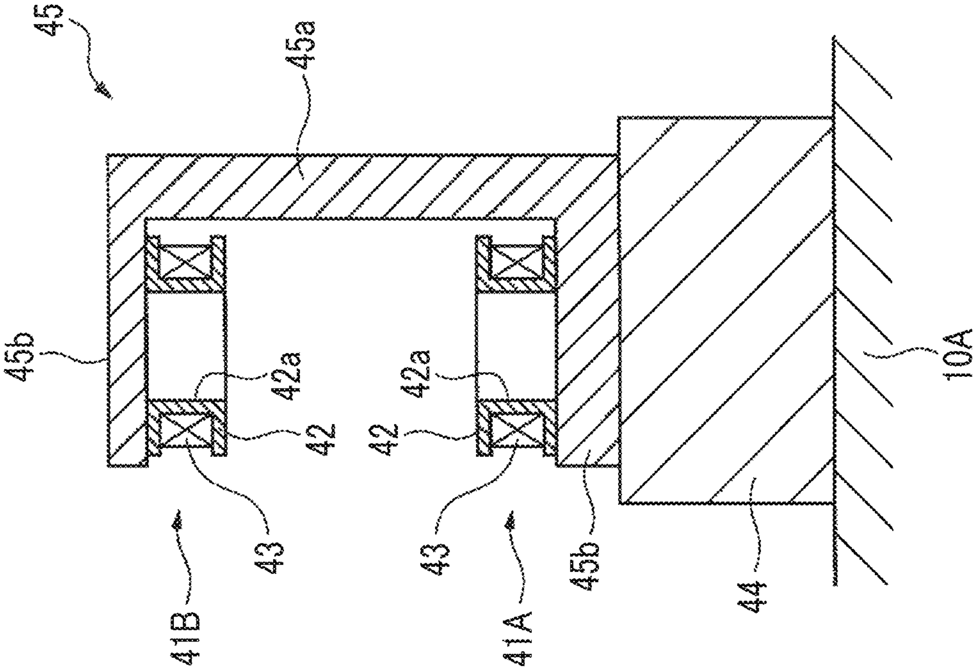
FIG. 4B is a diagram schematically showing a support structure of the magnetic flux density adjustment unit.
Figure 4A:
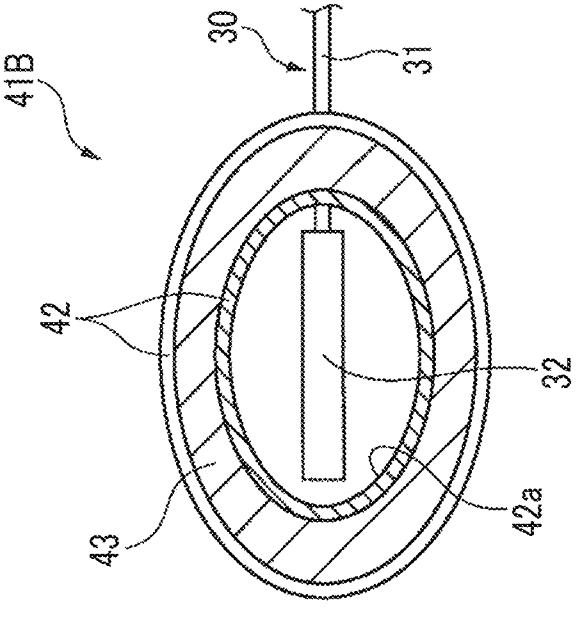
FIG. 4A is a diagram schematically showing a cross section taken along line IVA-IVA of FIG. 3.

As shown in FIGS. 3, 4A, and 4B, the magnetic flux density adjustment unit 40 has a pair of air core coils 41A and 41B. The air core coils 41A and 41B are disposed between the magnetic pole 10A and the magnetic pole 10B. Each of the air core coils 41A and 41B includes a winding frame 42 having an elliptical opening 42*a*, and a coil winding 43 wound around the winding frame 42. The air core coils 41A and 41B are disposed to face each other in the same direction as the direction (vertical direction) in which the magnetic poles 10A and 10B face each other, and are disposed such that the foil 32 of the foil stripper 30 is located between the air core coils 41A and 41B. Further, as shown in FIG. 4A, the foil 32 is disposed so as to be located at the center of the opening 42*a* of the winding frame 42. By disposing the magnetic flux density adjustment unit 40 in this manner and making an electric current flow to the coil winding 43, the air core coils 41A and 41B can effectively generate the second magnetic flux density B2 around the foil 32.

The air core coils 41A and 41B are supported by a support stand 44 disposed in the valley region 11 of the magnetic pole 10A and a support 45 fixed onto the support stand 44, as shown in FIG. 4B, for example. The support 45 includes an extension portion 45*a* which extends in the vertical direction, and a pair of fixing portions 45*b* which extends in the direction crossing the vertical direction from both end portions of the extension portion 45*a*, and each of the air core coils 41A and 41B is fixed to the fixing portion 45*b*. The support stand 44 and the support 45 can be configured to be movable according to, for example, the operation of the foil stripper 30, in order to maintain the positional relationship between the air core coils 41A and 41B and the foil constant. The support stand 44 and the support 45 are formed of a nonmagnetic material such as aluminum or ceramic, for example.

It is acceptable if the magnetic flux density adjustment unit 40 can generate the second magnetic flux density B2 around the foil 32, and the positional relationship between the air core coils 41A and 41B and the foil 32 is not limited to the above. Further, the support structure of the magnetic flux density adjustment unit 40 is also not limited to the configuration shown in FIG. 4B and can be changed.

Figure 5B:
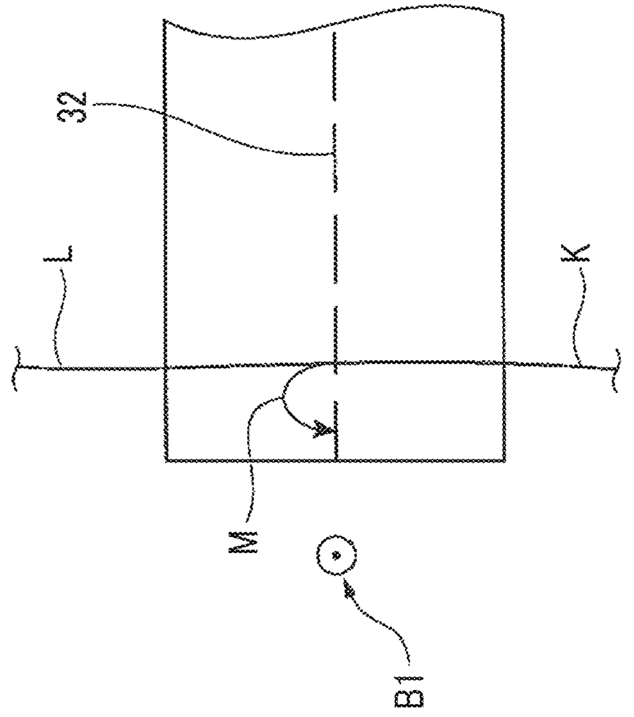
FIG. 5B is an enlarged view of a foil portion of FIG. 5A.
Figure 5A:
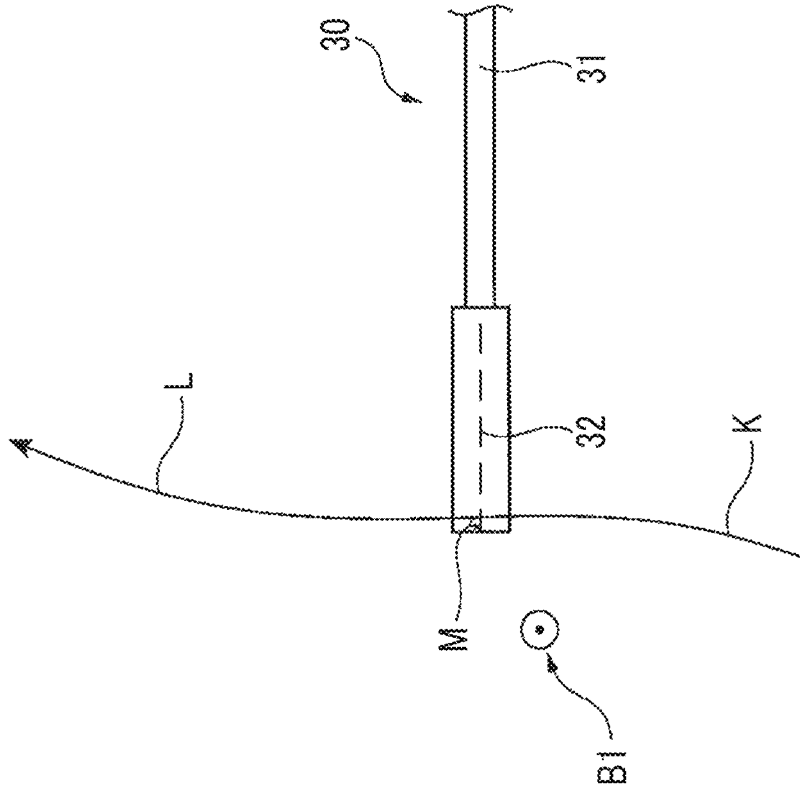
FIG. 5A is a diagram schematically showing the periphery of a foil stripper of a particle accelerator according to a comparative example.

Next, the difference between the orbit of the electron in a particle accelerator according to a comparative example and the orbit of the electron in the particle accelerator according to this embodiment will be described with reference to FIGS. 5A, 5B, and 6. FIG. 5A is a diagram schematically showing the periphery of a foil stripper of the particle accelerator according to the comparative example, and FIG. 5B is an enlarged view of a foil portion of FIG. 5A. Further, FIG. 6 is a diagram schematically showing the periphery of the foil stripper of the particle accelerator shown in FIGS. 1A and 1B.

As shown in FIGS. 5A and 5B, if the foil 32 intrudes onto the circling orbit K and comes into contact with the negative ions P, the electrons are stripped off from the negative ions P, and thus the negative ions P become protons. The protons are emitted from the emission port 51 (refer to FIGS. 2A and 2B) while drawing an orbit L which is curved in a direction directing outward from the circling orbit K. At this time, magnetic flux density B at the position of the foil 32 is the first magnetic flux density B1, and the electrons stripped off from the negative ions P draw an orbit M by being curved in a direction directing inward from the circling orbit K by the first magnetic flux density B1. Since the radius of gyration of the orbit M of the electrons is small, the electrons pass through the foil 32 again. In this way, the energy of the electrons is applied to the foil 32, and therefore, the foil 32 reaches a high temperature, and thus the life of the foil is shortened. As an example, in a 70 MeV H− (negative ion P) cyclotron, in a case where the first magnetic flux density B1 is 1 T, the energy of electrons is about 38 keV. In a case where 120 μg/cm2 of graphite is used as the foil 32, energy of about 1 keV is applied when the electrons pass through the foil 32. Under such conditions, the radius of gyration of the orbit M of the electrons is about 0.7 mm, and therefore, the electrons rotate and pass through the foil 32 many times, and thus there is a possibility that the energy of up to about 38 keV may be applied to the foil 32.

Figure 6:
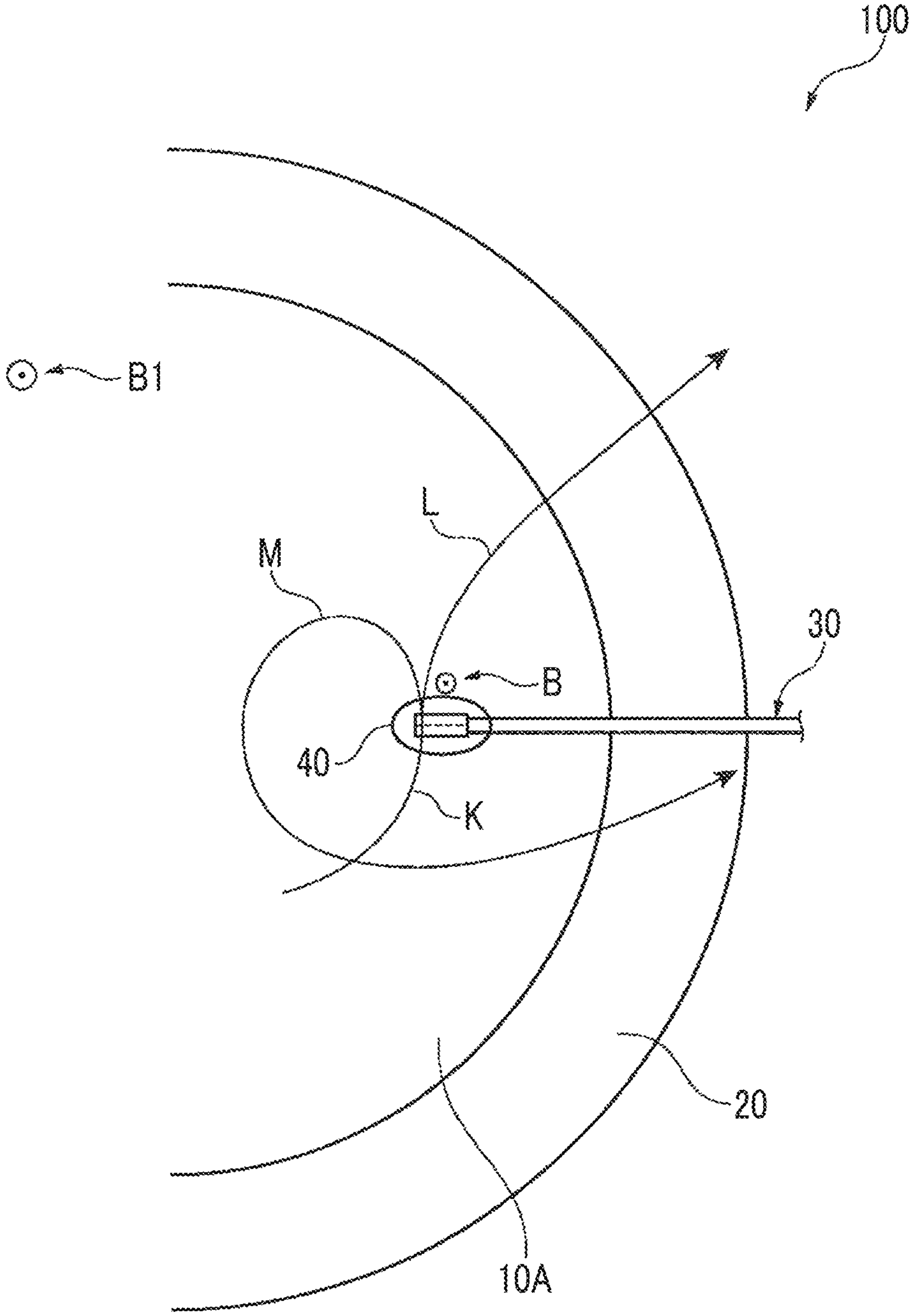
FIG. 6 is a diagram schematically showing the periphery of a foil stripper of the particle accelerator shown in FIGS. 1A and 1B.

In contrast, as shown in FIG. 6, in the particle accelerator 100, since the second magnetic flux density B2 is generated around the foil 32 by the magnetic flux density adjustment unit 40, the magnetic flux density B at the position of the foil 32 is the sum of the first magnetic flux density B1 and the second magnetic flux density B2. Since the first magnetic flux density B1 and the second magnetic flux density B2 direct in the opposite directions, they are canceled each other. In this way, the first magnetic flux density B1 is canceled by the second magnetic flux density B2, and the second magnetic flux density B2 is canceled by the first magnetic flux density B1, or they are offset each other. Therefore, if the absolute value of the second magnetic flux density B2 is smaller than twice the absolute value of the first magnetic flux density B1, the absolute value of the magnetic flux density B becomes smaller than the absolute value of the first magnetic flux density B1. FIG. 6 shows a case where the absolute value of the second magnetic flux density B2 is equal to or less than the absolute value of the first magnetic flux density B1. In this manner, by making the absolute value of the magnetic flux density B equal to or less than the absolute value of the first magnetic flux density B1, the radius of gyration of the orbit M of the electrons becomes larger, and therefore, it is possible to prevent the electrons from passing through the foil 32 again. As an example, in the case of the same conditions as those in the above example, if the magnetic flux density B (the sum of the first magnetic flux density B1 and the second magnetic flux density B2) at the position of the foil 32 is reduced to about 10 mT by the magnetic flux density adjustment unit 40, the radius of gyration of the orbit M of the electrons becomes about 67 mm.

It is preferable that the radius of gyration of the orbit M of the electrons is larger than the distance from the position where the negative ions P and the foil 32 come into contact with each other to the end portion of the foil 32. By setting the second magnetic flux density B2 in this manner, it is possible to more reliably prevent the electrons from passing through the foil 32 again. Further, since a gradient of the magnetic flux density B is formed around the foil 32 by the magnetic flux density adjustment unit 40, the radius of gyration of the electrons differs at the respective positions on the orbit M. In this way, even if the electrons pass through the foil 32 again, there is no case where the orbit M of the electrons draws a certain shape, and therefore, it is possible to prevent the electrons from passing through the same location of the foil 32 many times. Therefore, the energy of the electrons is prevented from being applied to a specific location of the foil 32 in a concentrated manner, and therefore, the life of the foil 32 can be extended.

As described above, the particle accelerator 100 is provided with the magnetic flux density adjustment unit 40 which generates the second magnetic flux density B2 directing in the opposite direction to the direction of the first magnetic flux density B1. The magnetic flux density adjustment unit 40 generates the second magnetic flux density B2 around the foil stripper 30 when viewed in a plan view, thereby making the absolute value of the magnetic flux density B (the sum of the first magnetic flux density B1 and the second magnetic flux density B2) at the position of the foil stripper 30 smaller than the absolute value of the first magnetic flux density B1. In this way, the radius of gyration at which the electrons rotate becomes larger compared to a case where the first magnetic flux density B1 is generated at the position of the foil stripper 30. Therefore, the foil 32 can be prevented from reaching a high temperature due to the electrons stripped off by the foil 32 passing through the foil 32 again. Therefore, it is possible to extend the life of the foil 32.

Further, the magnetic flux density adjustment unit 40 generates the second magnetic flux density B2 by the air core coils 41A and 41B. In this way, the magnitude of the second magnetic flux density B2 can be adjusted by adjusting an electric current flowing to the air core coils 41A and 41B. Therefore, it is possible to adjust the second magnetic flux density B2 to an optimal magnitude.

The embodiment of the present invention has been described above. However, the present invention is not limited to the embodiment described above, and various modifications can be made.

Figure 7:
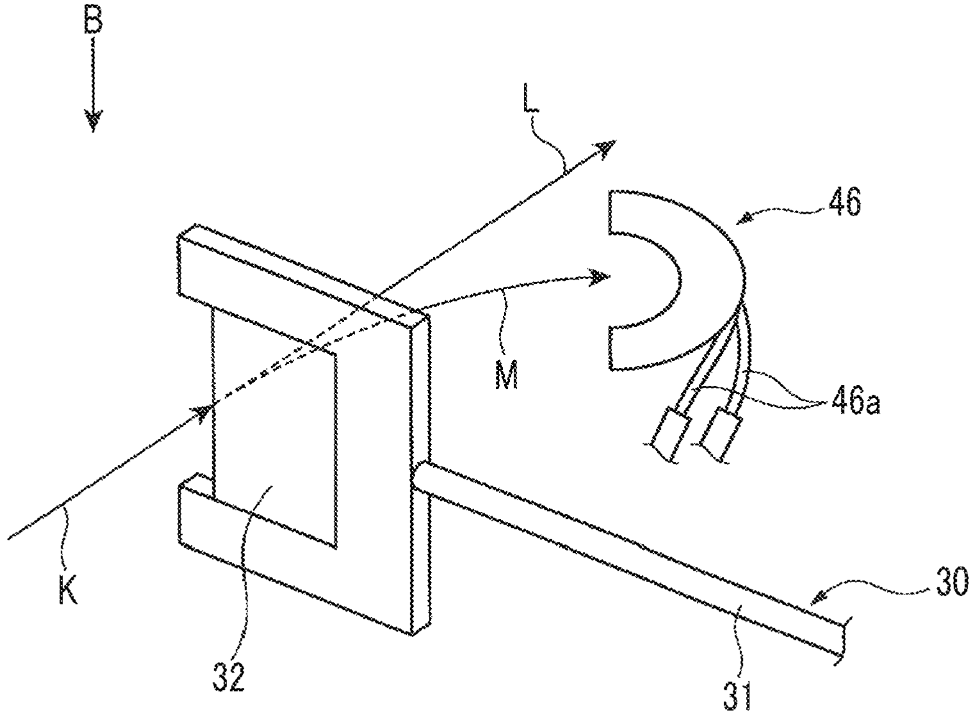
FIG. 7 is a diagram schematically showing a modification example of the magnetic flux density adjustment unit.

For example, in the embodiment described above, the absolute value of the second magnetic flux density B2 which is generated by the magnetic flux density adjustment unit 40 is equal to or less than the absolute value of the first magnetic flux density B1. However, the absolute value of the second magnetic flux density B2 may be made larger than the absolute value of the first magnetic flux density B1. That is, the second magnetic flux density B2 may be generated such that the direction of the magnetic flux density B at the position of the foil 32 is reversed. In this case, the first magnetic flux density B1 is canceled by the second magnetic flux density B2, and thus the absolute value of the magnetic flux density B becomes smaller than the absolute value of the first magnetic flux density B1. Further, in this case, the magnetic flux density adjustment unit 40 may have a recovery part 46 which recovers electrons outside the circling orbit K of the negative ions P. FIG. 7 is a diagram schematically showing a modification example of the magnetic flux density adjustment unit. As shown in FIG. 7, in a case where the direction of the magnetic flux density B at the position of the foil 32 is reversed, the electrons stripped off by the foil 32 draw the orbit M which is curved in a direction directing outward from the circling orbit K. The electrons which are curved in a direction directing outward from the circling orbit K are recovered by the recovery part 46. The recovery part 46 is formed in a concave shape such that, even if secondary electrons are generated due to the collision of the electrons, the secondary electrons do not escape to the outside of the recovery part 46. The concave shape may be a curved concave shape or a square concave shape. In order to suppress the escape of the secondary electrons in all directions, it is preferable that the recovery part 46 is indented over the entire circumference. The recovery part 46 is formed of, for example, a material having high thermal conductivity, such as copper. The recovery part 46 has a pipe 46*a* for circulating, for example, a refrigerant for cooling, and thus it is possible to suppress the heat generation of the recovery part 46 due to the energy applied to the electrons.

In this manner, by making the direction of the magnetic flux density B (the sum of the first magnetic flux density B1 and the second magnetic flux density B2) at the position of the foil stripper 30 the opposite direction to the direction of the first magnetic flux density B1, the electrons stripped off by the foil stripper 30 are curved in a direction directing outward from the circling orbit K. In this way, the electrons stripped off by the foil 32 can be prevented from passing through the foil 32 again. Further, since the electrons are curved in the direction directing outward from the circling orbit K, it is possible to recover the electrons by disposing the recovery part 46 outside the circling orbit K. Therefore, it is possible to more reliably prevent the electrons stripped off by the foil 32 from passing through the foil 32 again.

Figure 8:
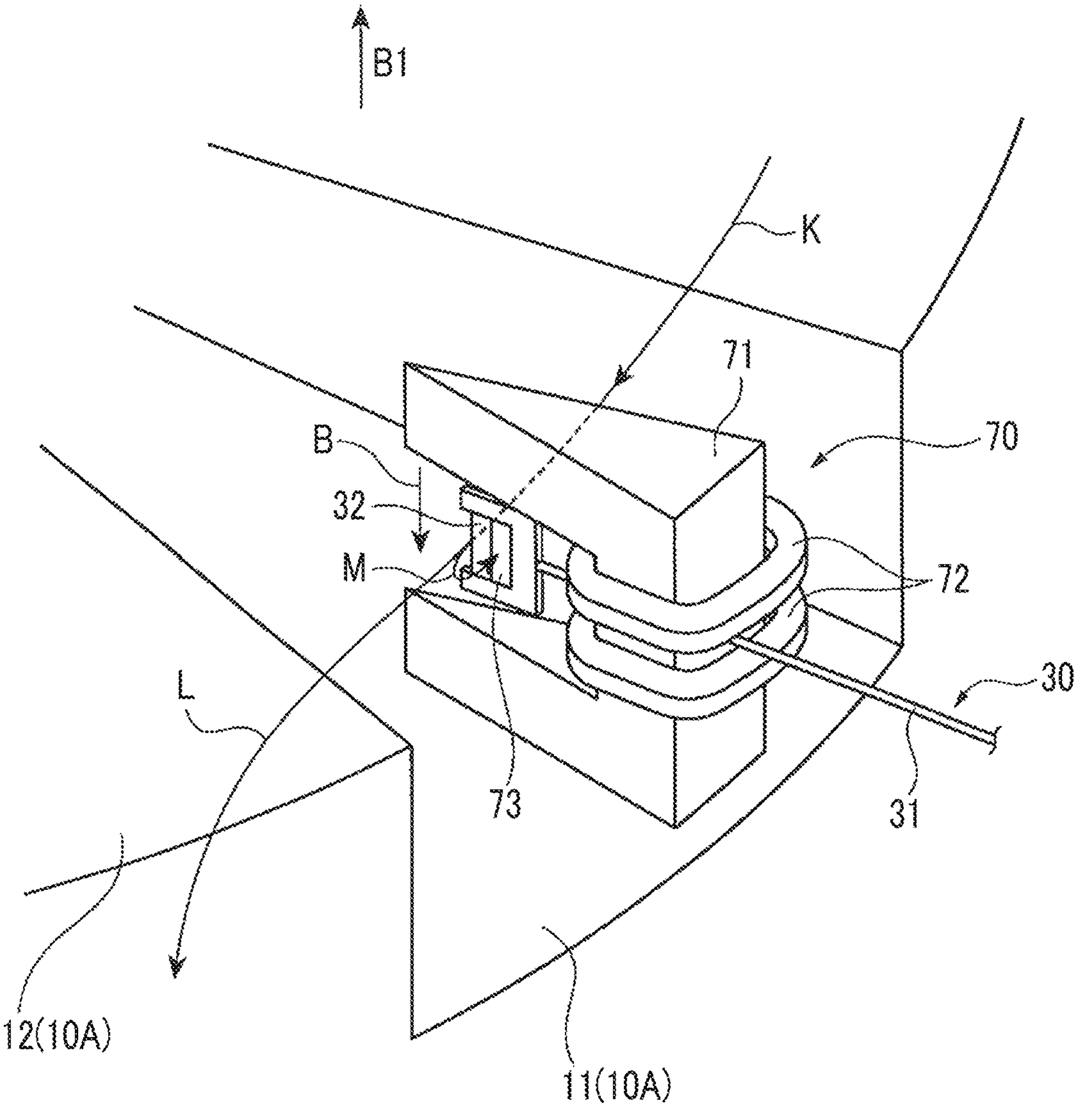
FIG. 8 is a diagram schematically showing a modification example of the magnetic flux density adjustment unit.

Further, in the embodiment described above, the magnetic flux density adjustment unit 40 generates the second magnetic flux density B2 by the air core coils 41A and 41B. However, the magnetic flux density adjustment unit 40 may generate the second magnetic flux density B2 by a magnet. FIG. 8 is a diagram schematically showing a modification example of the magnetic flux density adjustment unit. As shown in FIG. 8, a magnetic flux density adjustment unit 70 according to the modification example includes a C-shaped iron 71, a coil winding 72 wound around the iron 71, and a recovery part 73 against which electrons stripped off by the foil 32 hit. The iron 71 and the coil winding 72 configure a so-called deflection electromagnet. The recovery part 73 is formed of, for example, a copper plate or the like, and is disposed on the orbit M of the electrons. In an example, the recovery part 73 is disposed at a position adjacent to the foil 32. The recovery part 73 is cooled by, for example, water cooling. In this case, for example, by providing a passage for cooling water in the stripper drive shaft 31, it is possible to supply the cooling water to the recovery part 73.

Also in this configuration, by making the direction of the magnetic flux density B (the sum of the first magnetic flux density B1 and the second magnetic flux density B2) at the position of the foil stripper 30 the opposite direction to the direction of the first magnetic flux density B1, the electrons stripped off by the foil stripper 30 are curved in a direction directing outward from the circling orbit K. In this way, the electrons stripped off by the foil 32 can be prevented from passing through the foil 32 again. Further, the magnetic flux density adjustment unit 70 includes the iron 71, whereby it is possible to generate a large second magnetic flux density B2 even while making an electric current which is supplied to the coil winding 72 a low current. Further, compared to a case of using the air core coils 41A and 41B, it is possible to adjust the magnitude of the second magnetic flux density B2 in a wide range.

Further, the magnetic flux density adjustment unit 40 may generate the second magnetic flux density B2 by a magnet. In this way, it is possible to generate the second magnetic flux density B2 without requiring the supply of electric power.

It should be understood that the invention is not limited to the above-described embodiment, but may be modified into various forms on the basis of the spirit of the invention. Additionally, the modifications are included in the scope of the invention.

What is claimed is:

1. A particle accelerator comprising:

a pair of magnetic poles disposed to face each other;

a coil which surrounds each of the magnetic poles and generates a first magnetic flux density directing from the magnetic pole on one side to the magnetic pole on the other side;

a foil stripper provided on a circling orbit of charged particles to strip off electrons from the charged particles; and a magnetic flux density adjustment unit which generates a second magnetic flux density directing in an opposite direction to a direction of the first magnetic flux density, wherein the magnetic flux density adjustment unit makes an absolute value of magnetic flux density at a position of the foil stripper when viewed in a plan view smaller than an absolute value of the first magnetic flux density.

2. The particle accelerator according to claim 1, wherein the magnetic flux density adjustment unit generates the second magnetic flux density by a coil.

3. The particle accelerator according to claim 1, wherein the magnetic flux density adjustment unit generates the second magnetic flux density by a magnet.

4. The particle accelerator according to claim 1, wherein the magnetic flux density adjustment unit includes a recovery part which recovers the electrons outside the circling orbit of the charged particles, and the magnetic flux density adjustment unit generates the second magnetic flux density larger than the absolute value of the first magnetic flux density, thereby making a direction of the magnetic flux density at the position of the foil stripper when viewed in a plan view an opposite direction to a direction of the first magnetic flux density.

* * * * *